United States Patent
Sasamoto et al.

(10) Patent No.: US 9,880,459 B2
(45) Date of Patent: Jan. 30, 2018

(54) PHOTOMASK BLANK AND METHOD FOR PREPARING PHOTOMASK

(71) Applicant: Shin-Etsu Chemical Co., Ltd., Tokyo (JP)

(72) Inventors: Kouhei Sasamoto, Joetsu (JP); Souichi Fukaya, Joetsu (JP); Yukio Inazuki, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 52 days.

(21) Appl. No.: 15/206,537

(22) Filed: Jul. 11, 2016

(65) Prior Publication Data

US 2017/0031237 A1    Feb. 2, 2017

(30) Foreign Application Priority Data

Jul. 27, 2015  (JP) .................................. 2015-147819
May 19, 2016  (JP) .................................. 2016-100228

(51) Int. Cl.
*G03F 1/20* (2012.01)
*G03F 1/22* (2012.01)
*G03F 1/78* (2012.01)
*G03F 1/38* (2012.01)

(52) U.S. Cl.
CPC ............... *G03F 1/20* (2013.01); *G03F 1/22* (2013.01); *G03F 1/38* (2013.01); *G03F 1/78* (2013.01)

(58) Field of Classification Search
CPC ..................... G03F 1/20; G03F 1/22
See application file for complete search history.

(56) References Cited

U.S. PATENT DOCUMENTS

| | | | |
|---|---|---|---|
| 6,599,667 B2 | 7/2003 | Yusa et al. | |
| 7,166,392 B2 | 1/2007 | Ushida et al. | |
| 7,771,893 B2 | 8/2010 | Yoshikawa et al. | |
| 9,299,531 B2 | 3/2016 | Asami et al. | |
| 2004/0058252 A1 | 3/2004 | Mathuni et al. | |
| 2011/0229807 A1 | 9/2011 | Hashimoto et al. | |
| 2011/0250529 A1 | 10/2011 | Nozawa | |

FOREIGN PATENT DOCUMENTS

| | | |
|---|---|---|
| DE | 10344048 A1 | 1/2006 |
| EP | 1582920 A2 | 10/2005 |
| EP | 2237109 A2 | 10/2010 |
| EP | 2312392 A2 | 4/2011 |
| JP | 61-267054 A | 11/1986 |
| JP | 63-85553 A | 4/1988 |
| JP | 2001-312043 A | 11/2001 |
| JP | 3093632 U | 5/2003 |
| JP | 2003-195479 A | 7/2003 |
| JP | 2003-195483 A | 7/2003 |
| JP | 2007-33470 A | 2/2007 |
| JP | 2014-216407 A | 11/2014 |

OTHER PUBLICATIONS

Extended European Search Report for European Application No. 16178198.4, dated Dec. 16, 2016.

*Primary Examiner* — Stephen D Rosasco
(74) *Attorney, Agent, or Firm* — Birch, Stewart, Kolasch & Birch, LLP

(57) ABSTRACT

In a photomask blank comprising a transparent substrate, a resistance layer, and a conductive layer, the resistivity and thickness of the conductive layer and the resistivity and thickness of the resistance layer are selected so as to meet a specific equation (1). In EB lithography, a ground can be established at a necessary fully low resistance value, and EB writing be carried out at a high accuracy.

7 Claims, 5 Drawing Sheets

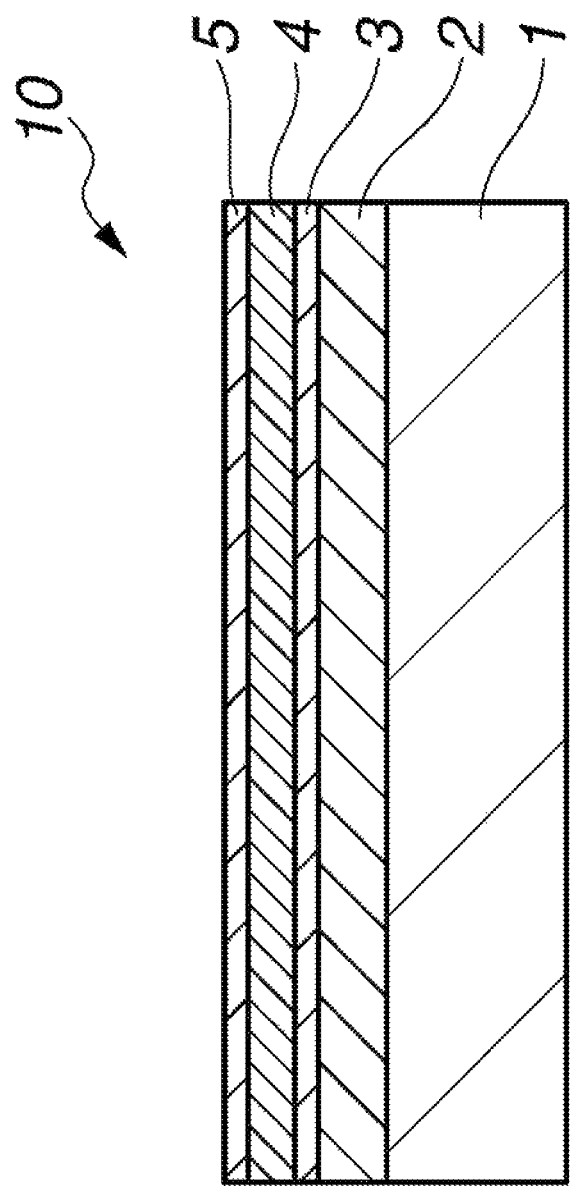

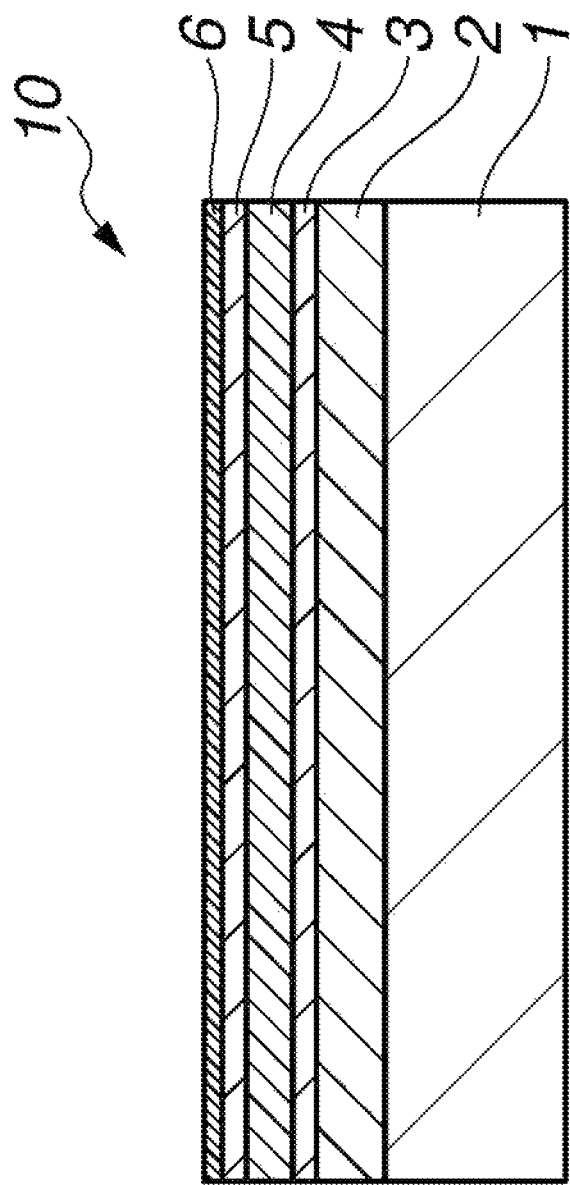

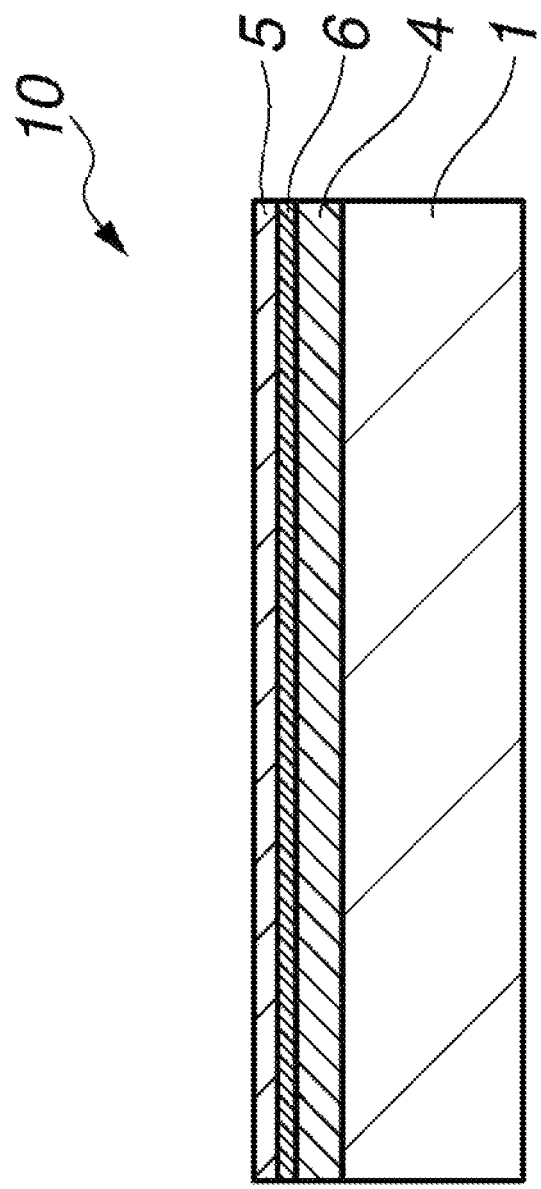

US 9,880,459 B2

PHOTOMASK BLANK AND METHOD FOR PREPARING PHOTOMASK

CROSS-REFERENCE TO RELATED APPLICATION

This non-provisional application claims priority under 35 U.S.C. § 119(a) on Patent Application Nos. 2015-147819 and 2016-100228 filed in Japan on Jul. 27, 2015 and May 19, 2016, respectively, the entire contents of which are hereby incorporated by reference.

TECHNICAL FIELD

This invention relates to a photomask blank which is processed into a photomask suitable for pattern transfer using exposure light of sub-200 nm wavelength, and a method for preparing a photomask from the blank.

BACKGROUND ART

For goals like a higher speed of operation and a saving of power consumption of microelectronic devices, the challenge to higher integration of large-scale integrated circuits continues. To meet increasing demands for shrinkage of circuit patterns, the advanced semiconductor microprocessing technology becomes important. For example, the technology for shrinkage of circuit-constructing wiring patterns and the technology for shrinkage of contact hole patterns for cell-constructing inter-layer connections become essential.

The advanced microprocessing technology relies on the photolithography using photomasks. The photomask is one important area of the miniaturization technology as are the lithography system and resist material. For the purpose of obtaining a photomask having a fine-size wiring pattern or fine-size contact hole pattern as mentioned above, efforts are made to develop the technique of forming a more fine and accurate pattern on a photomask.

Since the photolithography for microprocessing semiconductor substrates employs reduction projection, the size of a pattern formed on a photomask is about 4 times the size of a pattern formed on a semiconductor substrate. This does not mean that the accuracy of the pattern formed on the photomask is accordingly loosened. It is necessary that the photomask pattern be formed at a high accuracy.

At the present, the size of a circuit pattern written on a semiconductor substrate by photolithography is far smaller than the wavelength of exposure light. If reduction exposure is carried out using a photomask having a pattern which is a mere 4-time magnification of the circuit pattern, the photomask pattern is not faithfully transferred to the resist film due to interference of exposure light and other impacts.

Super-resolution masks addressing the problem include OPC masks in which the so-called optical proximity correction (OPC), i.e., the technology for correcting the optical proximity effect of degrading transfer properties is applied to photomasks and phase shift masks which cause a phase shift of 180° between adjacent pattern features to establish a sharp intensity distribution of incident light. For example, in some OPC masks, an OPC pattern (hammer head, assist bar or the like) having a size of less than half of a circuit pattern is formed. The phase shift masks include halftone, Levenson and chromeless types.

To form a photomask pattern on a photomask substrate at a high accuracy, a resist film formed on the photomask blank must be patterned at a high accuracy. In general, a photomask pattern is formed by starting with a photomask blank having a light-shielding film on a transparent substrate, forming a photoresist film on the photomask blank, exposing the photoresist film to light or electron beam (EB) to write a pattern, and developing the photoresist film to form a photoresist pattern. Then, with the photoresist pattern made mask, the light-shielding film is etched or patterned to form the photomask pattern. To obtain a fine photomask pattern, it is effective to reduce the thickness of a photoresist film (i.e., thinner resist film) for the following reason.

If only a resist pattern is shrunk without reducing the thickness of a resist film, the resist pattern feature functioning as the etching mask for the light-shielding film has a higher aspect ratio (ratio of resist film thickness to feature width). In general, as the aspect ratio of resist pattern features becomes higher, the pattern profile is more likely to degrade. Then the accuracy of pattern transfer to the light-shielding film via the resist pattern as the etch mask is reduced. In extreme cases, the resist pattern partially collapses or strips off, resulting in pattern dropouts. In association with the shrinkage of a photomask pattern, It is necessary that the resist film used as the etching mask during patterning of a light-shielding film be thinned to prevent the aspect ratio from becoming too high. An aspect ratio of up to 3 is generally recommended. To form a resist pattern having a feature width of 70 nm, for example, a resist film thickness of up to 210 nm is preferable.

For the light-shielding film which is etched using the pattern of photoresist as an etch mask, on the other hand, a number of materials have been proposed. In particular, neat chromium films and chromium compound films containing chromium and at least one of nitrogen, oxygen and carbon are generally used as the light-shielding film material. For example, Patent Documents 1 to 3 disclose photomask blanks wherein chromium compound films are formed as the light-shielding film having light shielding properties necessary for the photomask blank for use in ArF excimer laser lithography.

The light-shielding film in the form of chromium compound film is generally patterned by oxygen-containing chlorine dry etching, during which an organic film, typically photoresist film can be frequently etched to a noticeable extent. If the light-shielding film in the form of chromium compound film is etched with a relatively thin resist film made mask, the resist film is damaged during the etching so that the resist pattern is deformed. It is then difficult to transfer the resist pattern accurately to the light-shielding film.

The attempt to endow the photoresist or organic film with high resolution and high patterning accuracy as well as etch resistance encounters a technical barrier. The photoresist film must be reduced in thickness for the goal of high resolution whereas thinning of the photoresist film must be limited for the purpose of ensuring etch resistance during etching of the light-shielding film. As a result, there is a tradeoff relationship between high resolution/patterning accuracy and etch resistance. To mitigate the load to the photoresist to enable film thickness reduction for eventually forming a photomask pattern of higher accuracy, the construction (including thickness and composition) of a light-shielding film to be patterned must be ameriolated.

As to light-shielding film materials, a number of studies have been made. For example, Patent Document 4 discloses a metal film as the light-shielding film for ArF excimer laser lithography. Specifically, tantalum is used as the light-shielding film and tantalum oxide used as the antireflective film. To mitigate the load applied to the photoresist during etching of these two layers, the layers are etched with a fluorine-base gas plasma which causes relatively few damages to the photoresist. Despite a choice of such etching conditions, when two layers, light-shielding film and anti-reflective film are etched using only the photoresist as etch mask, the mitigation of the load to the photoresist is limited. It is difficult to fully meet the requirement to form a fine size photomask pattern at a high accuracy.

As discussed above, the prior art photomask blank structure is difficult to fully meet the requirement to form a fine size photomask pattern on the light-shielding film at a high accuracy. The problem becomes more serious with the photolithography using exposure light of shorter wavelength and requiring higher resolution, typically light with a wavelength of up to 200 nm (ArF excimer laser of 193 nm, $F_2$ laser of 157 nm).

As the light-shielding film exhibiting a high etch rate during chlorine-base dry etching that enables to mitigate the load to the photoresist for eventually forming a fine size photomask pattern at high accuracy, Patent Document 5 describes a light-shielding film based on chromium and having light elements O and N added thereto. The light element-containing chromium film reduces its conductivity with the increasing content of light elements.

For the fabrication of photomasks, on the other hand, the exposure method using electron beam (EB) is the mainstream of resist patterning. For EB emission, a high accelerating voltage of 50 keV is employed in order to enable further miniaturization. While there is a tendency that the resist reduces its sensitivity in order to achieve a higher resolution, the current density of EB In the EB lithography system experiences a remarkable leap from 40 A/cm$^2$ to 800 A/cm$^2$ from the aspect of productivity enhancement.

When EB is directed to an electrically floating photomask blank, electrons accumulate on the surface of the photomask blank to charge it at a negative potential. An electric field due to the electric charge causes the EB trajectory to be bent, resulting in a low accuracy of writing position. To avoid such fault, the EB lithography system adapted for high energy/high density EB writing is designed such that EB writing is performed with the photomask blank being grounded. For example, Patent Document 6 discloses an earth mechanism for grounding a photomask blank using an earth pin.

However, if ground resistance is significant, the potential of the photomask blank surface increases by the product of ground current and ground resistance, and the accuracy of writing position is accordingly reduced. Also, in examples where no sufficient ground is established, or the photomask blank is not conductive, the ground resistance is very high or infinitely high. If EB writing is performed in this state, an abnormal discharge or substrate failure can occur within the imaging vacuum chamber, causing contamination to the system. Thus the EB lithography system is equipped with a mechanism for measuring a ground resistance prior to the writing step. The threshold of ground resistance is set at $1.5 \times 10^5 \Omega$, for example. When the ground resistance measured exceeds the threshold, the writing step is interrupted before its start.

For a portion of the system which comes in contact with the photomask blank for grounding, there is the problem that particles are generated when the pin is penetrated through the EB resist film. To overcome the problem, several proposals are made. In Patent Document 6, for example, a cover is shaped so as to surround the earth pin for preventing particles from scattering. After penetration of the pin, a grounding mark is left in the EB resist film. In general, as the grounding mark is smaller, particle generation is more suppressed. One exemplary improvement is to change the shape of the grounding member from the blade type adapted to establish a ground by line contact to the pin type adapted to establish a ground by point contact. Another improvement is made to suppress any enlargement of the grounding mark by a positional shift after the contact of the earth pin.

CITATION LIST

Patent Document 1: JP-A 2003-195479
Patent Document 2: JP-A 2003-195463
Patent Document 3: JP-U 3093632
Patent Document 4: JP-A 2001-312043
Patent Document 5: JP-A 2007-033470
Patent Document 6: JP-A 2014-216407 (U.S. Pat. No. 9,299,531)
Patent Document 7: JP-A S63-85553

DISCLOSURE OF INVENTION

On use of the EB lithography system, the earth pin is brought in contact with the photomask blank. In the prior art method, the photomask blank or earth pin or both the photomask blank and earth pin are moved for contact by a motor or other mechanical means. Then due to the influence of vibration or mechanical motion during or after the contact, a scratch mark of several microns is generated on a multilayer film deposited on the photomask blank surface. The earth pin makes a break in the multilayer film on the photomask blank surface in the contact area. By bringing the earth pin in contact with any conductive layer in the multilayer film, a ground is readily established at a necessary, fully low resistance value. On the other hand, in the EB lithography system wherein grounding marks are observed as small spots and less particles are scattered, even when the multilayer film on the photomask blank includes a conductive layer, it sometimes fails to establish a ground at a necessary, fully low resistance value.

With respect to the photomask blank and photomask, however, the countermeasure for charge buildup in the EB lithography system is necessary. Several proposals are made to include in the multilayer film a conductive layer in which a sheet resistance as measured by the four-terminal method meets the recommended value. In conjunction with the multilayer film including a resistance layer on a conductive layer, it has never been studied from the relationship of resistivity to thickness of the resistance layer how to establish a ground in the EB lithography system.

An object of the invention is to provide a photomask blank which is processed into a photomask having necessary optical properties, for example, a sufficient optical density at exposure wavelength and a sufficient reflectance in a wavelength region longer than the exposure wavelength, and which ensures that a ground is established at a necessary, fully low resistance value when a mask pattern is written on the photomask blank using an EB lithography system, which is designed such that a ground is established as point contact and a grounding mark is observed as a spot. Another object is to provide a method for preparing a photomask from the photomask blank.

The inventors have found that in a photomask blank comprising a transparent substrate, a resistance layer disposed at the outermost level on a side remote from the substrate, the resistance layer having a resistivity of at least 0.1 Ω·cm, and a conductive layer disposed contiguous to the substrate-adjacent surface of the resistance layer, the conductive layer having a resistivity of less than 0.1 Ω·cm, the resistivity and thickness of the resistance layer and conductive layer are selected so as to meet a specific equation; that a photomask prepared from the photomask blank has necessary optical properties, for example, a sufficient optical density at exposure wavelength and a sufficient reflectance in a wavelength region longer than the exposure wavelength; that when a mask pattern is written on the photomask blank using an EB lithography system, which is designed such that a ground is established as point contact and a grounding mark is observed as a spot, the photomask blank ensures that a ground is established at a necessary, fully low resistance value. Then the photomask blank may be processed into a photomask suitable for pattern transfer using exposure light of wavelength up to 200 nm to form a pattern with a fine feature size.

In one aspect, the invention provides a photomask blank which is processed into a photomask suitable for pattern transfer using exposure light of wavelength up to 200 nm, comprising a transparent substrate, a resistance layer disposed at the outermost level on a side remote from the substrate and having a resistivity of at least 0.1 Ω·cm, and a conductive layer disposed contiguous to the surface of the resistance layer adjacent to the substrate and having a resistivity of less than 0.1 Ω·cm. The resistance layer is a single layer or a multilayer structure consisting of at least two sublayers, the single layer or each sublayer has a resistivity (expressed in Ω·cm) and a thickness (expressed in cm), with the proviso that when a resistivity value is not more than $7.5 \times 10^5$ Ω·cm, the resistivity is equal to that resistivity value, and when a resistivity value is more than $7.5 \times 10^5$ Ω·cm, the resistivity is equal to $7.5 \times 10^5$ Ω·cm. An index of resistance A, which is the product of resistivity and thickness when the resistance layer is a single layer, or the sum of the products of resistivity and thickness of sublayers when the resistance layer is a multilayer structure, meets the equation (1):

$$1.5 \times 10^5 A \times \alpha + \rho_c/d_c \quad (1)$$

wherein α is a constant (expressed in $cm^{-2}$), $\rho_c$ is the resistivity (expressed in Ω·cm) of the conductive layer, and $d_c$ is the thickness (expressed in cm) of the conductive layer.

In a preferred embodiment, the conductive layer has a sheet resistance of not more than $1 \times 10^4$ Ω/□.

In a preferred embodiment, the photomask blank further comprises a phase shift film between the substrate and the conductive layer, the phase shift film being formed of a silicon-containing material or a silicon and molybdenum-containing material.

In a preferred embodiment, the photomask blank further comprises a light-shielding film between the substrate and the conductive layer, the light-shielding film being formed of a silicon-containing material or a silicon and molybdenum-containing material.

Most often, the conductive layer is formed of a chromium-containing material.

Typically, the photomask blank is processed into a photomask by contacting a grounding terminal with the conductive layer, forcing the grounding terminal to press the conductive layer to such an extent as to establish electric conduction between the grounding terminal and the conductive layer, and performing EB writing in the grounded state.

In another aspect, the invention provides a method for preparing a photomask from a photomask blank, comprising the steps of furnishing the photomask blank defined above, forming a photoresist film on the resistance layer, contacting a grounding terminal with the resistance layer, forcing the grounding terminal to press the resistance layer to such an extent as to establish electric conduction between the grounding terminal and the conductive layer, and performing EB writing on the photoresist film in the grounded state. The photomask thus obtained is suitable for pattern transfer using exposure light of wavelength up to 200 nm.

ADVANTAGEOUS EFFECTS OF INVENTION

Although a photomask blank includes a multilayer film of reduced thickness, the blank may be processed into a photomask having necessary optical properties. Even when a mask pattern is written on the photomask blank using an EB lithography system, which is designed such that a ground is established as point contact, the photomask (blank) ensures to establish a ground at a necessary, fully low resistance value and prevents the resist film from being electrically charged during EB writing, thus enabling pattern transfer at a high accuracy of writing position.

BRIEF DESCRIPTION OF ACCOMPANYING DRAWINGS

FIG. 1 is a cross-sectional view of a photomask blank in one embodiment of the invention.

FIG. 2 is a cross-sectional view of a photomask blank in another embodiment of the invention.

FIG. 3 is a cross-sectional view of a photomask blank in a further embodiment of the invention.

Figure 4A:
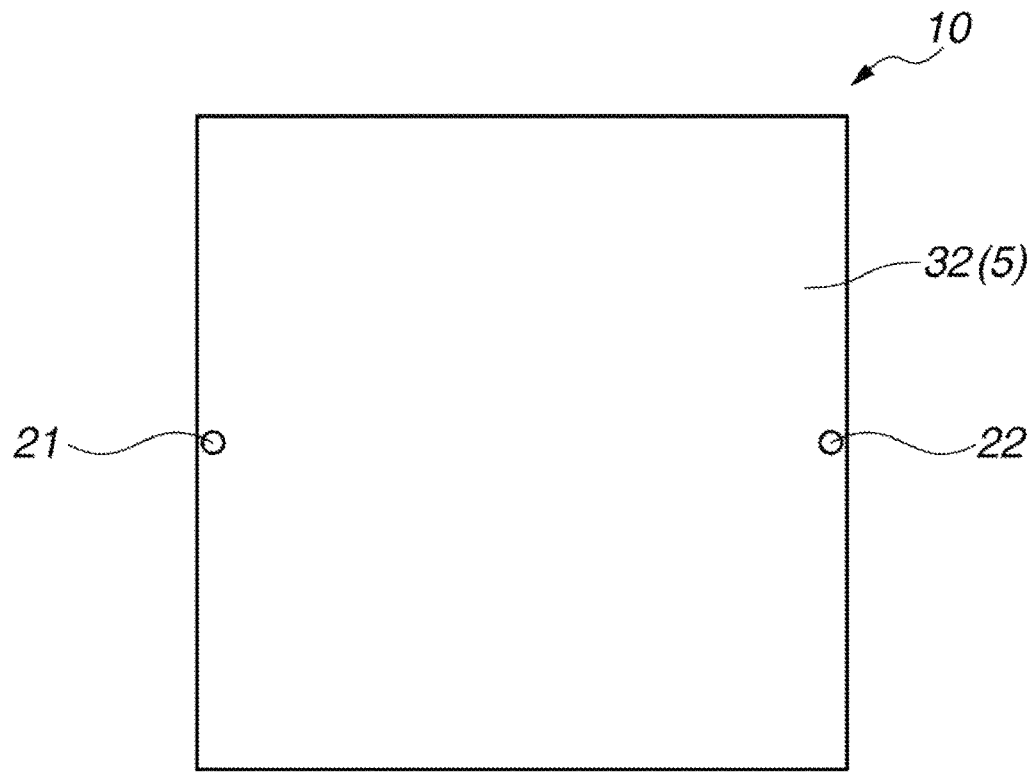
Figure 4B:
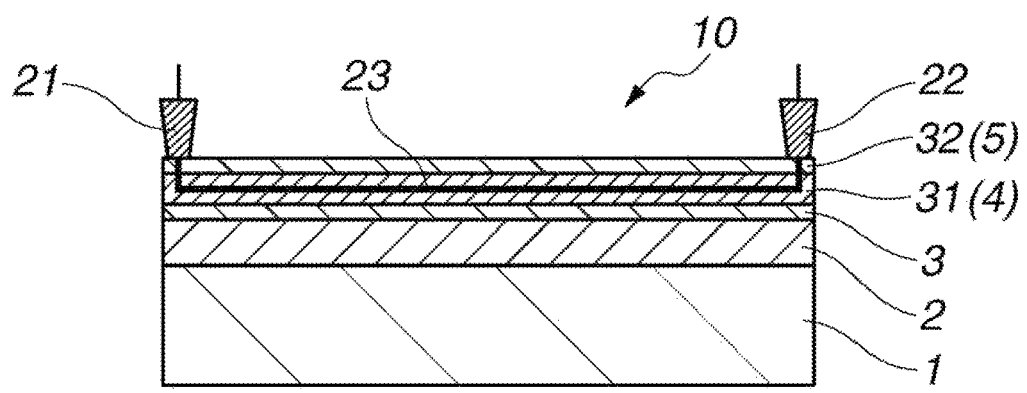

FIGS. 4(A) and 4(B) illustrate a main path of current flow upon measurement of electric properties with probes in contact with the surface of a resistance layer, FIG. 4(A) being a plan view with two probes in contact with the resistance layer surface and FIG. 4(B) being a cross-sectional view taken along a line connecting the centers of two probes.

Figure 5:
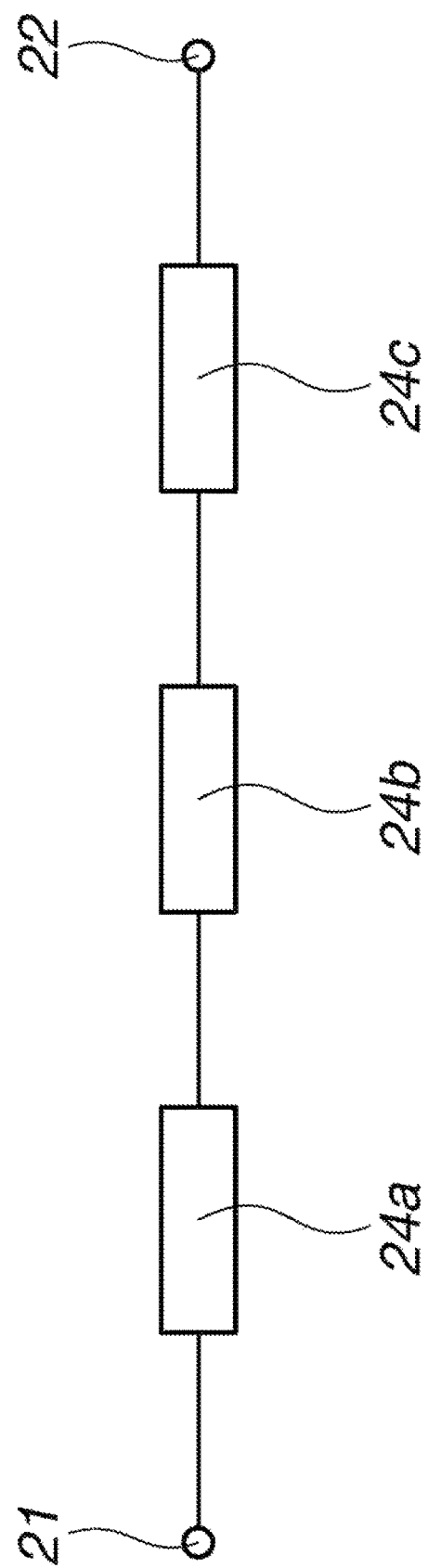

FIG. 5 is a diagram of an equivalent circuit showing current flow below the surface of the photomask blank.

DESCRIPTION OF PREFERRED EMBODIMENTS

The photomask blank of the invention is to be processed into a photomask suitable for pattern transfer using exposure light of wavelength up to 200 nm, typically ArF excimer laser of 193 nm or $F_2$ laser of 157 nm. For the photomask suitable for pattern transfer using exposure light of wavelength up to 200 nm, for example, light of wavelength 257 nm is used In defect inspection, and light of wavelength 405 nm (solid-state laser diode) is used in readout of alignment marks.

Preferably, the photomask blank is processed into a photomask by contacting a grounding terminal (or earth pin) with the resistance layer, forcing the grounding terminal to press the resistance layer to such an extent as to establish electric conduction between the grounding terminal and the conductive layer, typically to a resistivity of $1.5 \times 10^5$ Ω or below, and performing EB writing in the grounded state.

The photomask blank includes a transparent substrate, typically quartz substrate, a resistance layer disposed on the substrate and at the outermost level on a side remote from the substrate, the resistance layer having a resistivity of at least 0.1 Ω·cm, and a conductive layer disposed on the substrate and contiguous to the surface of the resistance layer which is disposed adjacent to the substrate, the conductive layer having a resistivity of less than 0.1 Ω·cm. The conductive layer may be disposed contiguous to or apart from the substrate. With respect to the combination of the resistance layer and the conductive layer, films to constitute the resistance layer and the conductive layer may be films having any functions as long as their resistivity falls in the ranges and their positions relative to the transparent substrate meet the above-defined relationship. For example, films to constitute the resistance layer and the conductive layer may be any of optical films such as light-shielding film, antireflective film, and phase shift film, typically halftone phase shift film, and auxiliary processing films such as etching mask film and etching stop film.

When the grounding terminal of an EB lithography system is brought into contact with a layer, the relevant layer is a high resistivity layer on which an EB resist film is formed. The resistance layer is a layer disposed at the outermost level on a side spaced remote from the substrate. The resistance layer may be a single layer or a multilayer structure consisting of two or more sublayers. In the case of the resistance layer of a single layer, a layer having a resistivity of at least 0.1 Ω·cm (i.e., $1\times10^{-1}$ Ω·cm) is relevant. In the case of the resistance layer of a multilayer structure, a sublayer having a resistivity of at least 0.1 Ω·cm (i.e., $1\times10^{-1}$ Ω·cm) is relevant. Yet a (sub)layer having a resistivity of at least 1 Ω·cm, and even at least 10 Ω·cm (i.e., $1\times10^{1}$ Ω·cm) is also relevant.

On the other hand, the conductive layer is a layer for providing electric conduction for preventing electric charging during EB writing when the grounding terminal of the EB lithography system is brought into contact with the resistance layer. The conductive layer should have a resistivity of less than 0.1 Ω·cm (i.e., $1\times10^{-1}$ Ω·cm), preferably up to $1\times10^{-2}$ Ω·cm, more preferably up to $1\times10^{-3}$ Ω·cm and be disposed contiguous to the resistance layer. The conductive layer should preferably have a sheet resistance of up to $1\times10^{4}$ ohm/square (Ω/□), more preferably up to $5\times10^{3}$ Ω/□. The conductive layer may be one sublayer of a multilayer film, that is, one resistance layer-adjacent sublayer of a multilayer film which is disposed contiguous to the resistance layer. The conductive layer may be disposed on the transparent substrate directly (without another intervening layer) or via another intervening layer. It is of no significance whether or not the other layer is conductive.

The materials of which the optical film and auxiliary processing film to constitute the photomask blank are made may be selected from transition metals, metals, alloys thereof, and compounds of such metals or alloys, depending on necessary optical properties and etching properties, as well as electric properties such as conductivity. Suitable transition metals include chromium (Cr), zirconium (Zr), tantalum (Ta), titanium (Ti), molybdenum (Mo), tungsten (W), iron (Fe), nickel (Ni) and cobalt (Co); suitable metals include silicon (Si), germanium (Ge) and aluminum (Al); and suitable compounds include oxides, nitrides, carbides, oxynitrides, oxycarbides, nitride carbides, and oxide nitride carbides. Of the metals, chromium (Cr), molybdenum (Mo), and silicon (Si) are preferred.

In general, metals, alloys, and compounds of metals or alloys having a low content of light element such as oxygen, nitrogen or carbon have a low resistivity. It is preferred that a film composed of such material is used as the conductive layer. By incorporating such a conductive layer into a photomask blank, the photomask blank is endowed with conductivity.

Optical properties or etching properties of a metal material or alloy material may be altered by increasing the amount of light element added thereto. For example, in the photomask blank to be processed into a photomask adapted for pattern transfer using exposure light of wavelength 200 nm or less, a chromium-containing material is used. Among the chromium-containing materials, chromium alone and chromium compounds having a low content of light element such as oxygen, nitrogen or carbon are preferably used as a light-shielding film because they exert a significant light-shielding effect.

On the other hand, the etching rate of a chromium-containing material during oxygen-containing chlorine-base dry etching (commonly used in etching of chromium-containing material) may be increased by adding a light element to the chromium-containing material. This enables high-speed etching of a light-shielding film, resulting in the advantage that upon etching of a light-shielding film through a mask, the burden on a photoresist film (typically chemically amplified resist film) serving as the etching mask may be mitigated.

Further, a film of a chromium-containing material with a high transmittance is obtained by increasing the amount of light element added thereto. A film formed of chromium alone or a chromium compound having a low light element content is a film with a high reflectance, which is disadvantageous in defect inspection on photomask blanks or photomasks. Therefore, a film made of a chromium-containing material with an increased light element content is generally used as the antireflective film. Specifically, an antireflective film is provided on one or both of the sides of the light-shielding film which are disposed adjacent to and remote from the substrate.

However, when a light element is added to a metal material or alloy material, its resistivity increases and its conductivity decreases with the increasing amount of light element. When a film made of such material is formed at the outermost level on the side of the photomask blank disposed remote from the transparent substrate, specifically as a layer on which a EB resist film is formed, charge buildup occurs thereon during EB writing, inviting a drop of writing accuracy. In particular, addition of oxygen as the light element invites a significant increase of resistivity, resulting in a high resistance film.

FIG. 1 is a cross-sectional view of one exemplary photomask blank of such construction. The photomask blank 10 is a phase shift mask blank including a phase shift film 2, a back side antireflective film 3, a light-shielding film 4, and a front side antireflective film 5 stacked in order on a transparent substrate 1. In this embodiment, for example, the light-shielding film 4 is a conductive layer, and the front side antireflective film 5 is a resistance layer of monolayer structure. Herein the phase shift film 2 and back side antireflective film 3 correspond to other layers. The photomask blank of this construction is preferably a blank including a conductive layer of chromium-containing material. Exemplary is a phase shift mask blank including the phase shift film 2 of silicon-containing material or silicon/molybdenum-containing material, the back side antireflective film 3 of chromium compound, the light-shielding film 4 of chromium alone or chromium compound, and the front side antireflective film 5 of chromium compound stacked in order on the transparent substrate 1, typically quartz substrate.

Further, a hard mask film may also be formed as the auxiliary processing film serving during etching of the light-shielding film or antireflective film. The use of the hard mask film allows the photoresist film to be thinned to comply with further pattern miniaturization. Thinning of the photoresist film enables to shorten the time of EB writing, thus suppressing charge buildup. For example, when the light-shielding film or antireflective film is formed of a chromium-containing material, the hard mask film is formed of a material which is quickly etched upon fluorine-base dry etching, but has an extremely low etching rate upon oxygen-containing chlorine-base dry etching, i.e., is not substantially etched. As the hard mask film-forming material, silicon-containing materials are preferred, for example, silicon alone, silicon compounds containing a light element such as oxygen, nitrogen or carbon, and similar silicon compounds having further added thereto a transition metal (other than chromium) such as molybdenum, tantalum, tungsten, zirconium or titanium.

However, like the above-mentioned light-shielding film or antireflective film, the hard mask film has the problem that conductivity becomes poor, despite advantageous etching properties, as the amount of light element added to the metal material or alloy material increases.

FIG. 2 is a cross-sectional view of an exemplary photomask blank of such construction. The photomask blank 10 is a phase shift mask blank including a phase shift film 2, a back side antireflective film 3, a light-shielding film 4, a front side antireflective film 5, and an etching mask film 6 stacked in order on a transparent substrate 1. In this embodiment, for example, the light-shielding film 4 is a conductive layer, and the front side antireflective film 5 and etching mask film 6 are a resistance layer of two-layer structure, i.e., consisting of two sublayers. Herein the phase shift film 2 and back side antireflective film 3 correspond to other layers. The photomask blank of this construction is preferably a blank including a conductive layer of chromium-containing material. Exemplary is a phase shift mask blank including the phase shift film 2 of silicon-containing material or silicon/molybdenum-containing material, the back side antireflective film 3 of chromium compound, the light-shielding film 4 of chromium alone or chromium compound, the front side antireflective film 5 of chromium compound, and the etching mask film 6 of silicon oxide (SiO) stacked in order on the transparent substrate 1, typically quartz substrate.

Further, as the auxiliary processing film serving during etching of the light-shielding film or antireflective film, a hard mask film may be formed thereon. When the etching mask film is formed of a metal alone, alloy, or a metal or alloy compound with a minute amount of light element added, the film of such material surely has a conductivity, but a high reflectance, which may be disadvantageous in a certain situation such as defect inspection of photomask blanks or photomasks. In such cases, an antireflective film may be formed on the etching mask film. The antireflective film used herein is formed of a material having an increased content of light element, like the above-mentioned antireflective film formed of chromium-containing material. In this case too, the antireflective film has the problem that conductivity becomes poor as the amount of light element added increases.

FIG. 3 is a cross-sectional view of an exemplary photomask blank of such construction. The photomask blank 10 is a photomask blank to be processed into a binary mask or Levenson type phase shift mask, including a light-shielding film 4, an etching mask film 6, and a front side antireflective film 5 stacked in order on a transparent substrate 1. In this embodiment, for example, the etching mask film 6 is a conductive layer, and the front side antireflective film 5 is a resistance layer of monolayer structure. Herein the light-shielding film 4 corresponds to another layer. The photomask blank of this construction is preferably a blank including a conductive layer of chromium-containing material. Exemplary is a photomask blank including the light-shielding film 4 of silicon-containing s material or silicon/molybdenum-containing material, the etching mask film 6 of chromium alone or chromium compound, and the front side antireflective film 5 of chromium compound stacked in order on the transparent substrate 1, typically quartz substrate.

The photomask blank of the invention is a photomask blank including a resistance layer and a conductive layer as mentioned above, wherein the resistance layer and the conductive layer are constructed such that provided that the single layer or each sublayer of the resistance layer has a resistivity and thickness, and an index of resistance A is the product of resistivity and thickness when the resistance layer is a single layer, or the sum of the products of resistivity and thickness of sublayers when the resistance layer consists of multiple sublayers, the index of resistance A meets the equation (1):

$$1.5\times10^5 \geq A\times\alpha+\rho_c/d_c \qquad (1)$$

wherein $\alpha$ is a constant (expressed in $cm^{-2}$) which is associated with a cross-sectional area S across the path of electric current flowing through the resistance layer as will be described later, $\rho_c$ is the resistivity (expressed in $\Omega\cdot cm$) of the conductive layer, and $d_c$ is the thickness (expressed in cm) of the conductive layer. Herein, when a resistivity value is not more than $7.5\times10^5$ $\Omega\cdot cm$, the resistivity (expressed in $\Omega\cdot cm$) of the resistance layer is equal to that resistivity value, and when the resistivity value is more than $7.5\times10^5$ $\Omega\cdot cm$, the resistivity of the resistance layer is equal to $7.5\times10^5$ $\Omega\cdot cm$. The thickness is expressed in unit cm.

Specifically, the index of resistance A is represented by the equation (1-1):

$$A=\rho_{r1}\times d_{r1}+\ldots+\rho_{rn}\times d_{rn} \qquad (1-1)$$

wherein $\rho_{r1}$ is the resistivity ($\Omega\cdot cm$) of 1st sublayer, $d_{r1}$ is the thickness (cm) of 1st sublayer, $\rho_{rn}$ is the resistivity ($\Omega\cdot cm$) of n-th sublayer, and $d_{rn}$ is the thickness (cm) of n-th sublayer. Provided that the resistance layer consists of a number (n) of sublayers, there are products of resistivity and thickness corresponding to the number (n), and the sum of these products is the index of resistance A. Now that the resistance layer and the conductive layer are constructed so as to meet equation (1), the photomask blank ensures a high accuracy of imaging performance when processed by an EB lithography system. When a photomask is prepared from the photomask blank, the photomask bears a mask pattern with a high dimensional accuracy.

FIG. 4 illustrates a main path of current flow upon measurement of electric properties with probes in contact with the surface of a resistance layer which consists of a single layer as in the photomask blank of FIG. 1. FIG. 4(A) is a plan view showing that two probes 21, 22 are in contact with the surface of a resistance layer 32 (front side antireflective film 5) in the photomask blank 10. FIG. 4(B) is a cross-sectional view taken along a line connecting the centers of two probes 21, 22. The positions of contact of two probes 21, 22 are on the surface of the photomask blank 10, specifically on the outer periphery of the surface of resistance layer 32 of square shape having a pair of opposed sides and near the centers of opposed sides. When two probes 21, 22 are brought into contact with the surface of resistance layer 32 without penetrating resistance layer 32, a current path 23 is created between two probes 21 and 22, which begins from one probe 21, passes across resistance layer 32 toward conductive layer 31 (light-shielding film 4) beneath probe 21, reaches conductive layer 31, extends through conductive layer 31 toward the other probe 22, passes across resistance layer 32 beneath probe 22, and reaches the other probe 22. It is noted that the current flow through resistance layer 32 is negligible because the resistivity of resistance layer 32 is significantly higher than that of conductive layer 31.

FIG. 5 is a diagram of an equivalent circuit (resistor circuit) showing current flow below the surface of the photomask blank. A path segment extending from probe 21 across resistance layer 32 to conductive layer 31 is a resistor 24a having a resistance $R_{f1}$ (Ω), a path segment through conductive layer 31 is a resistor 24b having a resistance $R_c$ (Ω), and a path segment extending from conductive layer 31 across resistance layer 32 to other probe 22 is a resistor 24c having a resistance $R_{f1}'$ (Ω). If the contact areas of two probes 21, 22 with resistance layer 32 are equal, then $R_{f1}=R_{f1}'$ because the thickness of resistance layer 32 is constant. The equivalent circuit is a series circuit of resistors. Since the resistance of the photomask blank should be not more than $1.5 \times 10^5 Ω$, the following equation (2) should be met.

$$1.5 \times 10^5 \geq 2 \times R_{f1} + R_C \quad (2)$$

Where the resistance layer is a bilayer structure consisting of two sublayers as in the photomask blank of FIG. 2, the sum of the resistances of paths through sublayers and the resistance of a path through conductive layer should be not more than $1.5 \times 10^5 Ω$, the following equation (2-1) should be met.

$$1.5 \times 10^5 \geq 2 \times (R_{f1} + R_{f2}) + R_C \quad (2\text{-}1)$$

Where the resistance layer is a multilayer structure consisting of a number (n) of sublayers, the following equation (2-2) should be met.

$$1.5 \times 10^5 \geq 2 \times (R_{f1} + \ldots + R_{fn}) + R_C \quad (2\text{-}2)$$

It is noted that $R_{f2}$ and $R_{fn}$ correspond to $R_{f1}$ and $R_{f1}'$, that is, resistance (Ω) of second sublayer and resistance (Ω) of n-th sublayer, respectively.

When resistivities and thicknesses of sublayers, and sectional area S transverse the path of current flow through the resistance layer are substituted in equation (2-2), the equation is rewritten as equation (2-3).

$$1.5 \times 10^5 \geq 2 \times (\rho_{f1} \times d_{f1} + \ldots + \rho_{fn} \times d_{fn})/S + \rho_c/d_c \quad (2\text{-}3)$$

When $2/S=\alpha$ and equation (1-1) are substituted in equation (2-3), equation (1) is derived. Herein, the contact areas of two probes with the resistance layer are typically equal, and the cross-sectional area S is coincident with the contact area of one or another probe. If the contact area of each probe with the resistance layer is a circle having a diameter of 50 μm, for example, then the cross-sectional area S is about $2 \times 10^{-5}$ (cm$^2$), and α is $1 \times 10^5$ (cm$^{-2}$). While the value of α is determined from the contact area of a grounding pin of an EB lithography system with the photomask blank, for example, it may be set in a range of $1 \times 10^2$ to $1 \times 10^8$ (cm$^{-2}$). As the contact area of a probe with a photomask blank becomes smaller, the number of defects becomes smaller. If the contact area is too small, then the probe may have a shorter life. For those photomask blanks corresponding to photomasks of the sub-30-nm node generation, for example, the resistance layer and conductive layer are preferably constructed such that index of resistance A may meet equation (1) while α is in a range of $1 \times 10^4$ to $1 \times 10^6$ (cm$^{-2}$), especially $1 \times 10^5$ (cm$^{-2}$).

The other film which may be formed between the transparent substrate and the conductive film may be selected from optical films including light-shielding film, antireflective film, and phase shift film, typically halftone phase shift film. A film which will function as an etching stop film or etching mask film is also included as long as, after processing of the photomask blank into a photomask, the film is left on the photomask blank and will function as an optical film.

The phase shift film which is formed between the transparent substrate and the conductive film is preferably a phase shift film formed of a material containing silicon or a material containing silicon and a transition metal (other than chromium), especially molybdenum, when the conductive layer is formed of a chromium-containing material or a part or the entirety of the conductive layer and resistance layer is formed of a chromium-containing material. Suitable materials include silicon alone, compounds containing silicon and a light element such as oxygen, nitrogen or carbon, especially oxygen and/or nitrogen, and similar compounds having further added thereto a transition metal (other than chromium) such as molybdenum, tantalum, tungsten, zirconium or titanium, preferably molybdenum. In the case of a photomask blank having such a phase shift film, the thickness of the light-shielding film or antireflective film may be further reduced, as compared with a photomask blank without a phase shift film. In this case, when the overall optical density of the light-shielding film or the light-shielding film and antireflective film, and the phase shift film is set at least 2.0, preferably at least 3.0, a light-shielding ability necessary as the photomask is obtainable.

The light-shielding film which is formed between the transparent substrate and the conductive film is preferably a light-shielding film formed of a material containing silicon or a material containing silicon and a transition metal (other than chromium), especially molybdenum, when the conductive layer is formed of a chromium-containing material or a part or the entirety of the conductive layer and resistance layer is formed of a chromium-containing material. Suitable materials are the same as described above for the phase shift film.

The preferred method for depositing a thin film such as optical film or auxiliary processing film on a photomask blank is film deposition by sputtering because a film having high in-plane uniformity of optical properties and less defects is available.

While a photomask is prepared from the photomask blank by the steps of forming a resist film of chemically amplified resist composition on the photomask blank to enable image writing with EB, and patterning the resist film, an organic conductive film may be formed on the surface of the resist film. The organic conductive film is effective for further preventing any charge buildup during EB writing.

Another embodiment of the invention is a method for preparing a photomask involving the steps of furnishing the photomask blank defined above, forming a photoresist film on the resistance layer, contacting a grounding terminal with the resistance layer, forcing the grounding terminal to press the resistance layer to such an extent as to establish electric conduction between the grounding terminal and the conductive layer, and performing EB writing on the photoresist film in the grounded state. After the step of performing EB writing on the photoresist film, a resist pattern may be formed in a conventional manner. Then thin films including optical film and auxiliary processing film formed on the photomask blank are patterned using the resist pattern. The patterning steps may be carried out by any well-known techniques such as chlorine-base dry etching and fluorine-base dry etching.

In order to release the electric charges from the surface of the photomask blank during EB writing, the grounding terminal is contacted with the outer periphery of the surface of the photomask blank mounted on the EB lithography system. In order to effectively prevent defect formation during EB writing, the resist film on the outer periphery of the photomask blank surface may be stripped. If an organic conductive film is formed, the resist film and organic conductive film on the outer periphery of the photomask blank surface may be stripped. Then the grounding terminal may be brought in direct contact with the resistance layer, allowing for quick release of electric charge. Specifically, a resist film may be formed on the surface of the photomask blank, i.e., on the surface of the resistance layer, a portion of the resist film on the outer periphery of the resistance layer surface be stripped, an organic conductive film be formed thereon, and an outer peripheral portion of the organic conductive film be stripped.

Connection of the grounding terminal may also be achieved by forming an organic conductive film over an outer peripheral portion of the photomask blank and contacting the grounding terminal of the EB lithography system with the peripheral portion of the organic conductive film without stripping the peripheral portion of the organic conductive film, or by contacting the grounding terminal with the resistance layer without forming an organic conductive film.

EXAMPLE

Examples and Comparative Examples are given below by way of illustration and not by way of limitation.

Examples 1 to 3 and Comparative Examples 1, 2

DC magnetron sputtering deposition was carried out on a quartz substrate of 152 mm squares and 6 mm thick. A semi-transparent antireflective film having a high resistivity was deposited on the substrate by sputtering a target of metallic chromium and feeding 10 sccm (flow rate) of Ar gas, 15 sccm of $O_2$ gas, and 30 sccm of $N_2$ gas as the sputtering gas. A conductive light-shielding film corresponding to the conductive layer (C layer) was then formed thereon by sputtering a metallic chromium target and feeding 10 sccm of Ar gas, 2 sccm of $O_2$ gas, and 15 sccm of $N_2$ gas as the sputtering gas. Next, a semi-transparent antireflective film having a high resistivity corresponding to the monolayer resistance layer (I1 layer) was formed thereon by sputtering a metallic chromium target and feeding 11 sccm of Ar gas, 16 sccm of $O_2$ gas, and 30 sccm of $N_2$ gas as the sputtering gas. In this way, a photomask blank having a multilayer film of three layers was obtained.

Example 4

DC magnetron sputtering deposition was carried out on a quartz substrate of 152 mm squares and 6 mm thick. A semi-transparent antireflective film having a high resistivity was deposited on the substrate by sputtering a metallic chromium target and feeding 10 sccm of Ar gas, 11 sccm of $O_2$ gas, and 20 sccm of $N_2$ gas as the sputtering gas. A conductive light-shielding film corresponding to the conductive layer (C layer) was then formed thereon by sputtering a metallic chromium target and feeding 20 sccm of Ar gas, 2 sccm of $O_2$ gas, and 2 sccm of $N_2$ gas as the sputtering gas. Next, a semi-transparent antireflective film having a high resistivity corresponding to the monolayer resistance layer (I1 layer) was formed thereon by sputtering a metallic chromium target and feeding 12 sccm of Ar gas, 11 sccm of $O_2$ gas, and 30 sccm of $N_2$ gas as the sputtering gas. In this way, a photomask blank having a multilayer film of three layers was obtained.

Example 5

DC magnetron sputtering deposition was carried out on a quartz substrate of 152 mm squares and 6 mm thick. A semi-transparent antireflective film having a high resistivity was deposited on the substrate by sputtering a metallic chromium target and feeding 10 sccm of Ar gas, 15 sccm of $O_2$ gas, and 30 sccm of $N_2$ gas as the sputtering gas. A conductive light-shielding film corresponding to the conductive layer (C layer) was then formed thereon by sputtering a metallic chromium target and feeding 10 sccm of Ar gas, 2 sccm of $O_2$ gas, and 15 sccm of $N_2$ gas as the sputtering gas. Next, a semi-transparent, high resistivity antireflective film corresponding to the sublayer (I1 layer) of the resistance layer was formed thereon by sputtering a metallic chromium target and feeding 11 sccm of Ar gas, 16 sccm of $O_2$ gas, and 30 sccm of $N_2$ gas as the sputtering gas. Further, a high resistivity etching mask film corresponding to the sublayer (I2 layer) of the resistance layer was formed thereon by sputtering a silicon target and feeding 18 sccm of Ar gas and 5 scan of $O_2$ gas as the sputtering gas. In this way, a photomask blank having a multilayer film of four layers was obtained.

Comparative Example 3

DC magnetron sputtering deposition was carried out on a quartz substrate of 152 mm squares and 6 mm thick. A semi-transparent antireflective film having a high resistivity was deposited on the substrate by sputtering a metallic chromium target and feeding 10 sccm of Ar gas, 11 sccm of $O_2$ gas, and 20 sccm of $N_2$ gas as the sputtering gas. A conductive light-shielding film corresponding to the conductive layer (C layer) was then formed thereon by sputtering a metallic chromium target and feeding 20 sccm of Ar gas, 2 sccm of $O_2$ gas, and 2 sccm of $N_2$ gas as the sputtering gas. Next, a semi-transparent, high resistivity antireflective film corresponding to the sublayer (I1 layer) of the resistance layer was formed thereon by sputtering a metallic chromium target and feeding 12 sccm of Ar gas, 11 sccm of $O_2$ gas, and 30 sccm of $N_2$ gas as the sputtering gas. Further, a high resistivity etching mask film corresponding to the sublayer (I2 layer) of the resistance layer was formed thereon by sputtering a silicon target and feeding 5 sccm of Ar gas and 50 sccm of $O_2$ gas as the sputtering gas. In this way, a photomask blank having a multilayer film of four layers was obtained.

In Examples and Comparative Examples, C layer, I1 layer and I2 layer were deposited to the thickness shown in Table 1 by adjusting the deposition time. Electric properties of C layer, I1 layer and I2 layer were measured by the four terminal method, from which the resistivity and sheet resistance of C layer, I1 layer and I2 layer were computed and reported in Table 1. From the thickness and resistivity of each layer, the value of the right side of equation (1) was computed and reported in Table 1. It is noted that constant α in equation (1) is $1 \times 10^5$ ($cm^{-2}$) as calculated from the contact area of a grounding pin of an EB lithography system with the photomask blank. As is evident from Table 1, all Examples meet equation (1) whereas neither of Comparative Examples meets equation (1).

Next, the photomask blank was mounted on an EB lithography system. With grounding pins in contact with the photomask blank, the resistance between the grounding pins was measured. This EB lithography system was designed such that a ground was established as point contact and the grounding mark was observed as a spot. As a result, resistance values of less than $1.5 \times 10^5 \Omega$ were measured in all Examples, indicating that a ground was established at a necessary fully low resistance value. In Comparative Examples, a resistance value of more than $1.5 \times 10^5 \Omega$ was measured or a resistance value could not be accurately measured. That is, a ground was not established at a necessary fully low resistance value, indicating poor electric properties. With such a photomask blank, an abnormal electric discharge or substrate failure can occur within the imaging vacuum chamber, causing contamination to the system.

It is evident from the results that as long as the resistivity and thickness of the conductive layer and the resistivity and thickness of the resistance layer formed thereon are selected so as to meet equation (1), a ground can be established at a necessary fully low resistance value. EB writing can be carried out at a high accuracy.

proviso that when a resistivity value is not more than $7.5 \times 10^5$ Ω·cm, the resistivity is equal to that resistivity value, and when a resistivity value is more than $7.5 \times 10^5$ Ω·cm, the resistivity is equal to $7.5 \times 10^5$ Ω·cm, an index of resistance A, which is the product of resistivity and thickness when the resistance layer is a single layer, or the sum of the products of resistivity and thickness of sublayers when the resistance layer is a multilayer structure, meets the equation (1):

$$1.5 \times 10^5 A \times \alpha + \rho_c/d_c \tag{1}$$

wherein α is a constant (expressed in $cm^{-2}$), $\rho_c$ is the resistivity (expressed in Ω·cm) of the conductive layer, and $d_c$ is the thickness (expressed in cm) of the conductive layer.

2. The photomask blank of claim 1 wherein the conductive layer has a sheet resistance of not more than $1 \times 10^4 \Omega/\square$.

3. The photomask blank of claim 1, further comprising a phase shift film between the substrate and the conductive layer, the phase shift film being formed of a silicon-containing material or a silicon and molybdenum-containing material.

TABLE 1

|  |  | C layer | | | I1 layer | | I2 layer | | |
|---|---|---|---|---|---|---|---|---|---|
|  |  | Sheet resistance (Ω/□) | Resistivity (Ω·cm) | Thickness (cm) | Resistivity (Ω·cm) | Thickness (cm) | Resistivity (Ω·cm) | Thickness (cm) | Right side of equation (1) |
| Example | 1 | $5.7 \times 10^2$ | $2.0 \times 10^{-4}$ | $3.5 \times 10^{-7}$ | $1.0 \times 10^8$ | $1.0 \times 10^{-7}$ | none | | $8.07 \times 10^3$ |
|  | 2 | $5.7 \times 10^2$ | $2.0 \times 10^{-4}$ | $3.5 \times 10^{-7}$ | $1.0 \times 10^8$ | $7.0 \times 10^{-7}$ | none | | $5.31 \times 10^4$ |
|  | 3 | $5.7 \times 10^2$ | $2.0 \times 10^{-4}$ | $3.5 \times 10^{-7}$ | $1.0 \times 10^8$ | $1.2 \times 10^{-6}$ | none | | $9.06 \times 10^4$ |
|  | 4 | $3.4 \times 10^2$ | $1.2 \times 10^{-4}$ | $3.5 \times 10^{-7}$ | $1.1 \times 10^4$ | $2.2 \times 10^{-6}$ | none | | $2.76 \times 10^3$ |
|  | 5 | $5.7 \times 10^2$ | $2.0 \times 10^{-4}$ | $3.5 \times 10^{-7}$ | $1.0 \times 10^8$ | $7.0 \times 10^{-7}$ | $1.0 \times 10^8$ | $1.0 \times 10^{-6}$ | $1.28 \times 10^5$ |
| Comparative | 1 | $5.7 \times 10^2$ | $2.0 \times 10^{-4}$ | $3.5 \times 10^{-7}$ | $1.0 \times 10^8$ | $2.3 \times 10^{-6}$ | none | | $1.73 \times 10^5$ |
| Example | 2 | $5.7 \times 10^2$ | $2.0 \times 10^{-4}$ | $3.5 \times 10^{-7}$ | $1.0 \times 10^8$ | $3.7 \times 10^{-6}$ | none | | $2.78 \times 10^5$ |
|  | 3 | $3.4 \times 10^2$ | $1.2 \times 10^{-4}$ | $3.5 \times 10^{-7}$ | $1.1 \times 10^4$ | $2.7 \times 10^{-6}$ | $1.0 \times 10^8$ | $2.0 \times 10^{-6}$ | $1.53 \times 10^5$ |

It is noted that the invention is not limited to the aforementioned embodiments. While the embodiments are merely exemplary, any embodiments having substantially the same construction as the technical concept set forth in the following claims and exerting equivalent functions and results are believed to be within the spirit and scope of the invention.

Japanese Patent Application Nos. 2015-147819 and 2016-100228 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photomask blank which is processed into a photomask suitable for pattern transfer using exposure light of wavelength up to 200 nm, comprising a transparent substrate, a resistance layer disposed at the outermost level on a side remote from the substrate and having a resistivity of at least 0.1 Ω·cm, and a conductive layer disposed contiguous to the surface of the resistance layer adjacent to the substrate and having a resistivity of less than 0.1 Ω·cm, wherein said resistance layer is a single layer or a multilayer structure consisting of at least two sublayers, the single layer or each sublayer has a resistivity (expressed in Ω·cm) and a thickness (expressed in cm), with the proviso that when a resistivity value is not more than $7.5 \times 10^5$ Ω·cm, the resistivity is equal to that resistivity value, and when a resistivity value is more than $7.5 \times 10^5$ Ω·cm, the resistivity is equal to $7.5 \times 10^5$ Ω·cm, an index of resistance A, which is the product of resistivity and thickness when the resistance layer is a single layer, or the sum of the products of resistivity and thickness of sublayers when the resistance layer is a multilayer structure, meets the equation (1):

4. The photomask blank of claim 1, further comprising a light-shielding film between the substrate and the conductive layer, the light-shielding film being formed of a silicon-containing material or a silicon and molybdenum-containing material.

5. The photomask blank of claim 1 wherein the conductive layer is formed of a chromium-containing material.

6. The photomask blank of claim 1 wherein the photomask blank is processed into a photomask by contacting a grounding terminal with the conductive layer, forcing the grounding terminal to press the conductive layer to such an extent as to establish electric conduction between the grounding terminal and the conductive layer, and performing EB writing in the grounded state.

7. A method for preparing a photomask suitable for pattern transfer using exposure light of wavelength up to 200 nm from a photomask blank, the photomask blank comprising a transparent substrate, a resistance layer disposed at the outermost level on a side remote from the substrate and having a resistivity of at least 0.1 Ω·cm, and a conductive layer disposed contiguous to the surface of the resistance layer adjacent to the substrate and having a resistivity of less than 0.1 Ω·cm, the resistance layer being a single layer or a multilayer structure consisting of at least two sublayers, said method comprising the step of furnishing the photomask blank wherein the single layer or each sublayer has a resistivity (expressed in Ω·cm) and a thickness (expressed in cm), with the proviso that when a resistivity value is not more than $7.5 \times 10^5$ Ω·cm, the resistivity is equal to that resistivity value, and when a resistivity value is more than $7.5 \times 10^5$ Ω·cm, the resistivity is equal to $7.5 \times 10^5$ Ω·cm, and an index of resistance A, which is the product of resistivity and thickness when the resistance layer is a single layer, or the sum of the products of resistivity and thickness of sublayers when the resistance layer is a multilayer structure, meets the equation (1):

$$1.5 \times 10^5 \geq A \times \alpha + \rho_c/d_c \qquad (1)$$

wherein $\alpha$ is a constant (expressed in $cm^{-2}$), $\rho_c$ is the resistivity of the conductive layer (expressed in Ω·cm), and $d_c$ is the thickness of the conductive layer (expressed in cm), said method further comprising the steps of forming a photoresist film on the resistance layer, contacting a grounding terminal with the resistance layer, forcing the grounding terminal to press the resistance layer to such an extent as to establish electric conduction between the grounding terminal and the conductive layer, and performing EB writing on the photoresist film in the grounded state.

\* \* \* \* \*

UNITED STATES PATENT AND TRADEMARK OFFICE
CERTIFICATE OF CORRECTION

PATENT NO. : 9,880,459 B2
APPLICATION NO. : 15/206537
DATED : January 30, 2018
INVENTOR(S) : Kouhei Sasamoto et al.

It is certified that error appears in the above-identified patent and that said Letters Patent is hereby corrected as shown below:

In the Specification

At Column 2, Line 60, change "ameriolated" to --ameliorated--.

At Column 6, Line 57-58, change "conductive" to --resistance--.

At Column 6, Line 59, change "conductive" to --resistance--.

In the Claims

Claim 6, at Column 16, Line 48, change "conductive" to --resistance--.

Claim 6, at Column 16, Line 49, change "conductive" to --resistance--.

Signed and Sealed this
Thirteenth Day of August, 2019

Andrei Iancu
*Director of the United States Patent and Trademark Office*